(12) United States Patent
Ganesan

(10) Patent No.: US 11,837,768 B2
(45) Date of Patent: *Dec. 5, 2023

(54) ANTENNA PORT TERMINATION IN ABSENCE OF POWER SUPPLY

(71) Applicant: pSemi Corporation, San Diego, CA (US)

(72) Inventor: Sivakumar Ganesan, Austin, TX (US)

(73) Assignee: PSEMI CORPORATION, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/155,331

(22) Filed: Jan. 17, 2023

(65) Prior Publication Data

US 2023/0223672 A1 Jul. 13, 2023

Related U.S. Application Data

(63) Continuation of application No. 17/808,019, filed on Jun. 21, 2022, now Pat. No. 11,581,621, which is a continuation of application No. 16/751,042, filed on Jan. 23, 2020, now Pat. No. 11,380,970.

(51) Int. Cl.
  *H01P 1/24* (2006.01)
  *H03K 17/687* (2006.01)
  *H01Q 1/50* (2006.01)

(52) U.S. Cl.
  CPC ............... *H01P 1/24* (2013.01); *H01Q 1/50* (2013.01); *H03K 17/687* (2013.01)

(58) Field of Classification Search
  CPC ........... H01P 1/24; H01Q 1/50; H03K 17/687
  USPC ........................................................ 307/115
  See application file for complete search history.

(56) References Cited

U.S. PATENT DOCUMENTS

| | | | |
|---|---|---|---|
| 5,867,127 A * | 2/1999 | Black | H04B 1/3833 343/702 |
| 9,594,147 B2 * | 3/2017 | Han | G01R 29/0878 |
| 11,380,970 B2 | 7/2022 | Ganesan | |
| 11,581,621 B2 | 2/2023 | Ganesan | |
| 2016/0241140 A1 * | 8/2016 | Bakalski | H03K 17/161 |
| 2017/0033454 A1 * | 2/2017 | van Bezooijen | H01Q 1/50 |
| 2021/0210847 A1 * | 7/2021 | Su | H01Q 1/52 |

* cited by examiner

*Primary Examiner* — William Hernandez
(74) *Attorney, Agent, or Firm* — Steinfl + Bruno LLP

(57) ABSTRACT

Methods and devices to address antenna termination in absence of power supplies within an electronic circuit including a termination circuit and a switching circuit. The devices include regular NMOS devices that decouple the antenna from the switching circuit in absence of power supplies while the antenna is coupled to a terminating impedance having a desired impedance value through a native NMOS device. The antenna is coupled with the switching circuit via the regular NMOS device during powered conditions while the antenna is decoupled from the terminating impedance.

16 Claims, 5 Drawing Sheets

ANTENNA PORT TERMINATION IN ABSENCE OF POWER SUPPLY

CROSS REFERENCE TO RELATED APPLICATIONS

The present application is a continuation of U.S. non-provisional patent application Ser. No. 17/808,019, filed on Jun. 21, 2022, for "Antenna Port Termination In Absence of Power Supply" which is a continuation of U.S. non-provisional patent application Ser. No. 16/751,042, filed on Jan. 23, 2020, all of which are herein incorporated by reference in their entirety.

BACKGROUND

(1) Technical Field

The present disclosure is related to antenna port terminations, and more particularly to methods and apparatus for antenna port terminations in the absence of power supply.

(2) Background

Throughout this document the term "unpowered" refers to situations in an electronic circuit when some or all DC voltages to an electronic circuit have been removed, e.g., bias voltages applied to the electronic circuit are equal to zero or are floating. The term "powered" refers to situations in an electronic circuit where the electronic circuit has DC voltages applied as it would during RF operation.

Throughout this document the term "native NMOS device" refers to n-type metal oxide semiconductor (NMOS) transistors having a threshold voltage of close to or less than zero volts. The term "regular NMOS device" refers to NMOS transistors with a threshold voltage greater than zero volts.

FIG. 1A shows a prior art electronic circuit (100) including termination circuit (110) and switching circuit (120). The termination circuit (110) comprises an antenna (ANT), switch (S1) controlled by a first supply (Vss) and a termination impedance (Z), serially connected to one another. The switching circuit (120) comprises a plurality of single-pole single-throw (SPST) switches (SPST1, . . . , SPSTn) connecting antenna (ANT) to outputs (OUT1, . . . , OUTn) through respective inputs (IN1, . . . , INn). Each SPST switch (SPSTi), i=1, . . . , n, is controlled by a through control (THi) and a shunt control (SHi). FIG. 1B shows a prior art implementation of an SPST switch wherein the through control (TH) controls the through switch (Sa) and the shunt control (SH) controls the shunt switch (Sb). FIG. 1B' shows an alternative prior art implementation of an SPST switch wherein the through control (TH) controls the through switches (Sax, Say) and the shunt control (SH) controls the shunt switch (Sb).

With further reference to FIGS. 1A-1B, native NMOS devices are typically used to implement switch (S1) and the SPST switches (SPST1, . . . , SPSTn). In the powered condition, in order to connect an input (INi) to the respective output (OUTi), a positive voltage is applied to the through switch (Sa) via the through control (TH) and a negative voltage is applied to the shunt switch (Sb) via the shunt control (SH). In other words, the through switch (Sa) is closed, connecting the input (INi) to output (OUTi) and the shunt switch (Sb) is open, disconnecting the output (OUTi) from GND (or the lower reference voltage). Continuing with the powered condition, in order to disconnect an input (INi) from the corresponding output (OUTi), a negative voltage is applied to the through switch (Sa) via the through control (TH) and a positive voltage is applied to the shunt switch (Sb) via the shunt control (SH). In this case, the through switch (Sa) will be open and the shunt switch (Sb) is closed, connecting the output (OUTi) to the reference voltage (shown here as GND). In the powered condition, the antenna is not terminated, in other words, switch (S1) is open (Vss is a negative voltage) and the signal received by the antenna is routed to a selected output depending on the states of the SPST switches.

In the unpowered condition, it may be desired that the antenna is terminated by a desired impedance (e.g. 50 ohm or any other desired impedance Z). In such a condition, with continued reference to FIGS. 1A-1B, the power supplies are removed and all the through and shunt controls of the switches are experiencing zero bias voltages. As mentioned before, given that switches are implemented with native NMOS devices, switch (S1) is partially or fully closed and the antenna (ANT) is terminated through impedance (Z) to a reference voltage, shown here as GND. However, and for the same reason, switches in the switching circuit (120) are partially or fully closed such that the circuit (120) generates an additional and undesired load parallel to the termination impedance (Z). In other words, in the unpowered condition the antenna (ANT) will not be terminated by the desired impedance (Z) anymore due to such an undesired load imposed by the switching circuit. This creates a challenge when designing electronic circuits requiring a specific desired termination while in unpowered condition.

A solution to the above-mentioned problem is to use regular NMOS devices (with threshold voltages greater than zero) for switches of the SPSTi switches, instead of native NMOS devices, such that in the unpowered condition, the constituent switches of the switching circuit (120) of FIG. 1A are fully off. As a result, there will be no additional undesired load to the antenna. This solution comes at the expense of an Ron*Coff tradeoff, wherein Ron and Coff represent respectively the resistance of the NMOS devices in the ON state and the capacitance of the NMOS devices in the OFF state. As known to the person skilled in the art, the Ron of a regular NMOS device biased at a given voltage is higher than the Ron of a native NMOS device biased at the same voltage. Therefore, in such a tradeoff, the transistor designs are larger to achieve an acceptable Ron. The Coff of these larger designs will also be higher, and this will result in an overall performance degradation of the circuit at higher frequencies.

SUMMARY

Methods and devices described in the present disclosure address the antenna termination issue while in the unpowered condition as described above. The disclosed methods and devices provide solution to the issue without compromising the overall performance of the electronic circuit in the powered conditions.

According to a first aspect of the disclosure, an electronic circuit is provided, comprising: a) an RF switching circuit comprising transistors having a first threshold voltage; b) a termination circuit configured to be connected to the RF switching circuit, the termination circuit comprising a series connection of a first switch and a termination impedance, the first switch comprising one or more transistors having the first threshold voltage, the series connection including a node configured to receive a signal; c) a second switch between the termination circuit and the RF switching circuit, the second switch configured to connect the termination circuit with the switching circuit, the second switch comprising one or more transistors with a second threshold voltage, wherein the second threshold voltage is different from the first threshold voltage; wherein the first and the second threshold voltages are such that: i) in a powered condition of the electronic circuit: the first switch is in an OFF state; and the second switch is in an ON state, thereby connecting the termination circuit to the RF switching circuit; and ii) in an unpowered condition of the electronic circuit: the first switch is in an ON state, and the second switch is in an OFF state, thereby decoupling the RF switching circuit from the termination circuit.

According to a second aspect of the disclosure, a method of terminating an antenna of an electronic circuit in absence of power supplies, the electronic circuit including a switching circuit with a terminating impedance is disclosed, the method comprising: coupling the antenna to the terminating impedance, having a desired impedance value, through a first switch comprising one or more native NMOS transistors; coupling the antenna to the switching circuit through a second switch comprising one or more regular NMOS transistors; removing the power supplies from the electronic circuit, thereby: turning the first switch to an ON state, thereby terminating the antenna with the terminating impedance; and decoupling the antenna from the switching circuit through the second switch.

Further aspects of the disclosure are provided in the description, drawings and claims of the present application.

DETAILED DESCRIPTION

Figure 2:
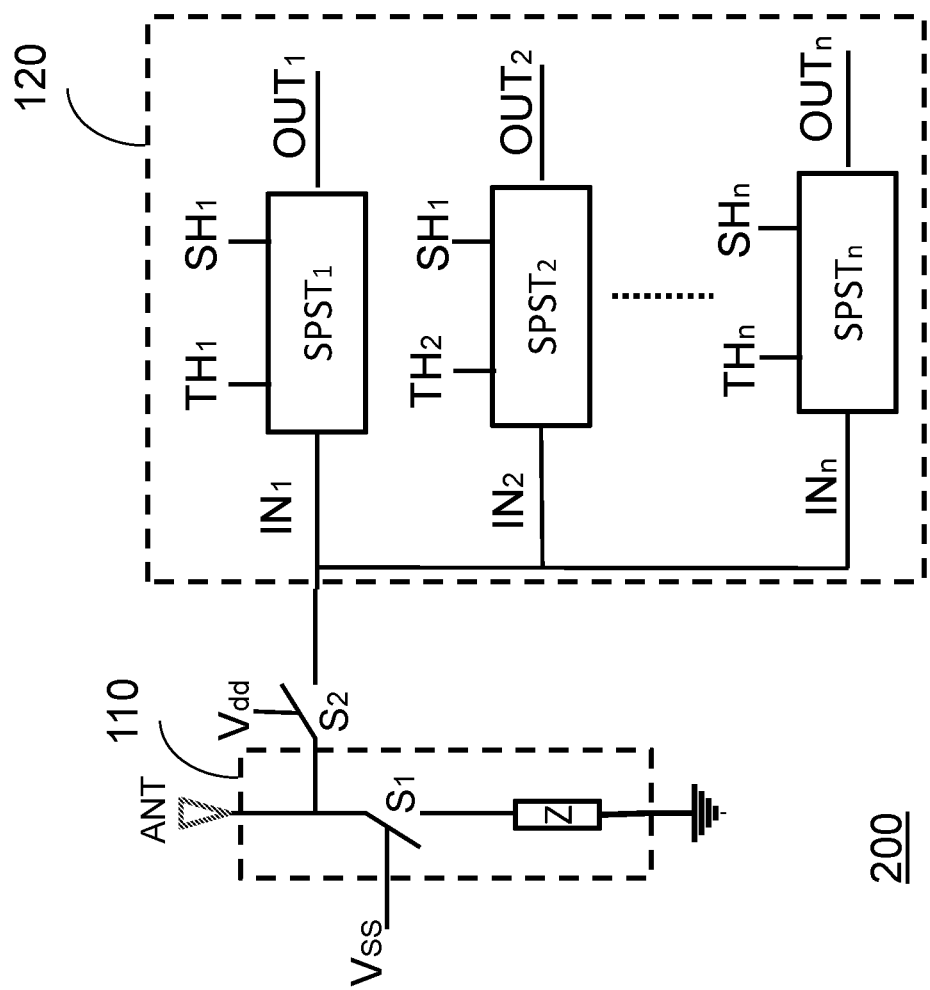
FIG. 2 shows an exemplary electronic circuit in accordance with an embodiment of the present disclosure.

FIG. 2 shows an electronic circuit (200) including termination circuit (110) and switching circuit (120) according to an embodiment of the present disclosure. The termination circuit (110) is connectable to antenna (ANT), and comprises switch (S1) controlled by a first supply voltage (Vss), and a termination impedance (Z), serially connected to one another. The switching circuit (120) comprises a plurality of single-pole single-throw (SPST) switches (SPST1, . . . , SPSTn) connecting antenna (ANT) to outputs (OUT1, . . . , OUTn) through respective inputs (IN1, . . . , INn). Each SPST switch (SPSTi), i=1, . . . , n, is controlled by a through control (THi) and a shunt control (SHi). The electronic circuit (200) further comprises a switch (S2) controlled by a second supply voltage (Vdd). In accordance with further embodiments of the present disclosure, supply voltage (Vdd) may provide a positive voltage and the switch (S2) may have a threshold voltage different from those of the switch (S1) and/or the constituent switches of the switching circuit (120). By way of example, and not of limitation, switch (S1) and constituent switches of the switching circuit (120) may be made using native NMOS transistors (i.e. with threshold voltages less than zero volts) and the switch (S2) may be made using regular NMOS transistors (i.e. with a threshold voltage greater than zero volts). In what follows, the functionality of the electronic circuit (200) will be described in more details.

Figure 1A:
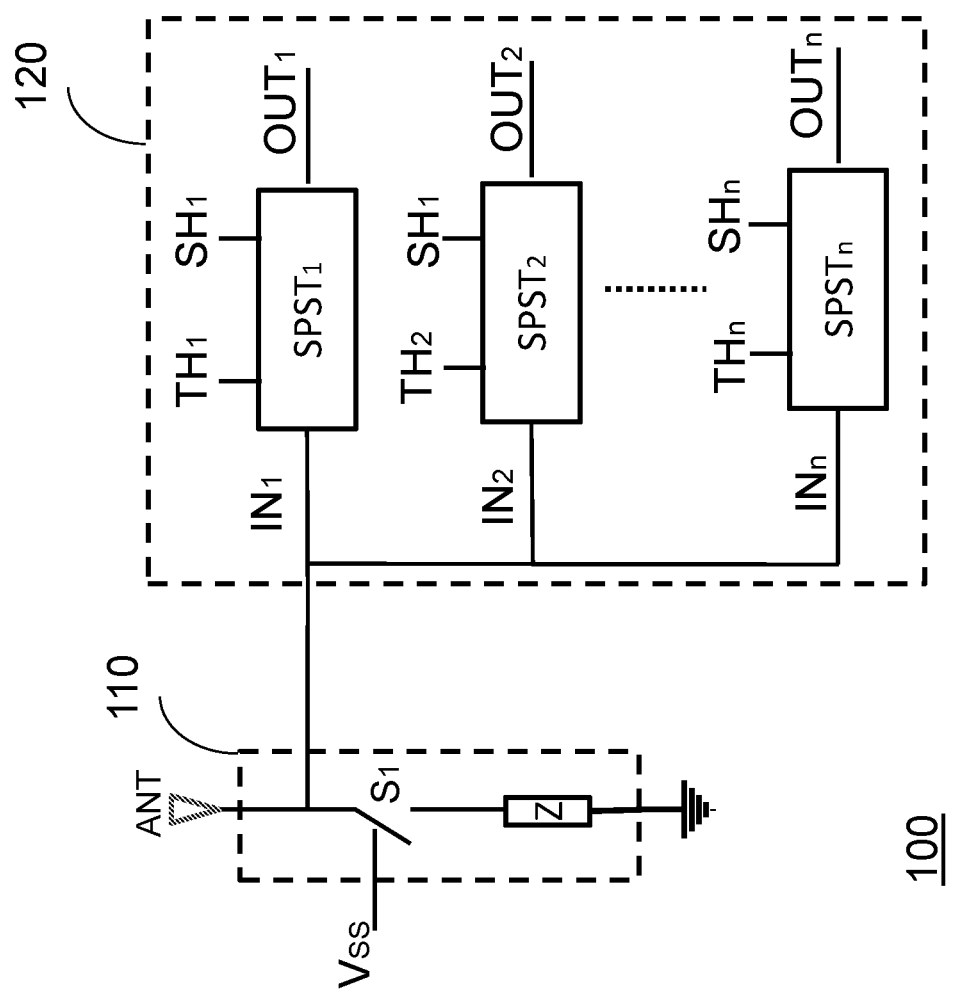
FIG. 1A shows a prior art electronic circuit.

With further reference to FIG. 2, in the powered mode, supply voltage (Vdd) is such that (e.g. positive voltage) the switch (S2) is closed, thereby coupling the antenna and termination circuit (110) to the switching circuit (120). As such, the overall functionality of the electronic circuit (200) in the powered mode is similar to what was described with regards to the electronic circuit (100) of FIG. 1A. Additionally, as switch (S2) is closed, the impact of switch (S2) on such overall functionality is minimal. As an example, the insertion loss of the switch (S2) when closed may typically be just a few hundredths of a dB.

With continued reference to FIG. 2, in the unpowered mode, all the applied bias voltages, including the THi controls, the SHi controls, Vdd, and Vss, are at zero volts. According to an embodiment of the present disclosure, switch (S2) may be implemented using regular NMOS devices. In other words, at zero bias voltage, switch (S2) is open, disconnecting and isolating the switching circuit (120) from the termination circuit (110) and antenna. This means that, as opposed to what was described previously with regards to the electronic circuit (100) of FIG. 1A, in this case, and regardless of the states of constituent switches of the switching circuit (120), the switching circuit (120) will not impact the impedance seen from the antenna as an additional and unwanted load. In accordance with embodiments of the present disclosure, in the unpowered mode, switch (S1) may be implemented using native NMOS devices. This means, switch (S1) will be at least partially closed or not fully open (with zero bias voltage applied) and as a result, the antenna will be terminated by the impedance (Z) which can be implemented based on the design requirements. In view of what was described, the person skilled in the art will appreciate that the disclosed solution addresses the issue of antenna termination in the unpowered mode with almost no impact on the normal functionality of the electronic circuit while in the powered mode.

Figure 1B:
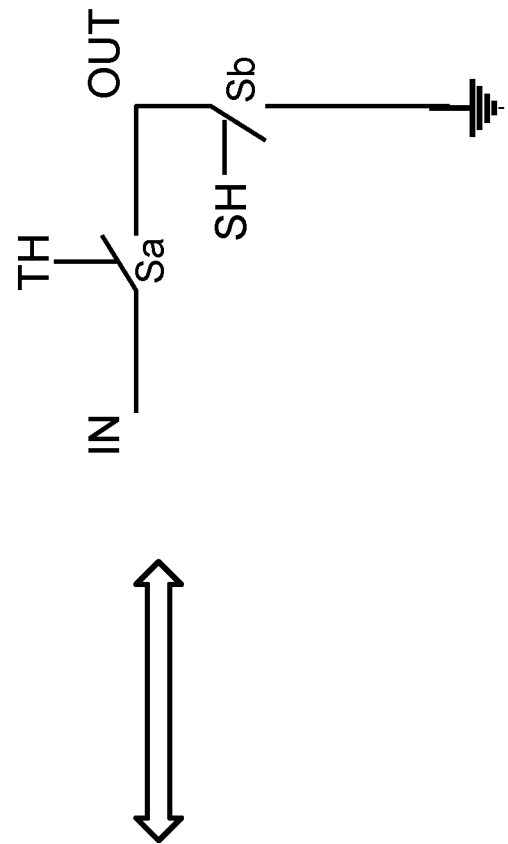
FIG. 1B-1B' show prior art implementations of an SPST.
Figure 1B:
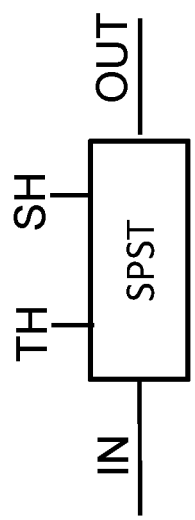
Figure 1B:
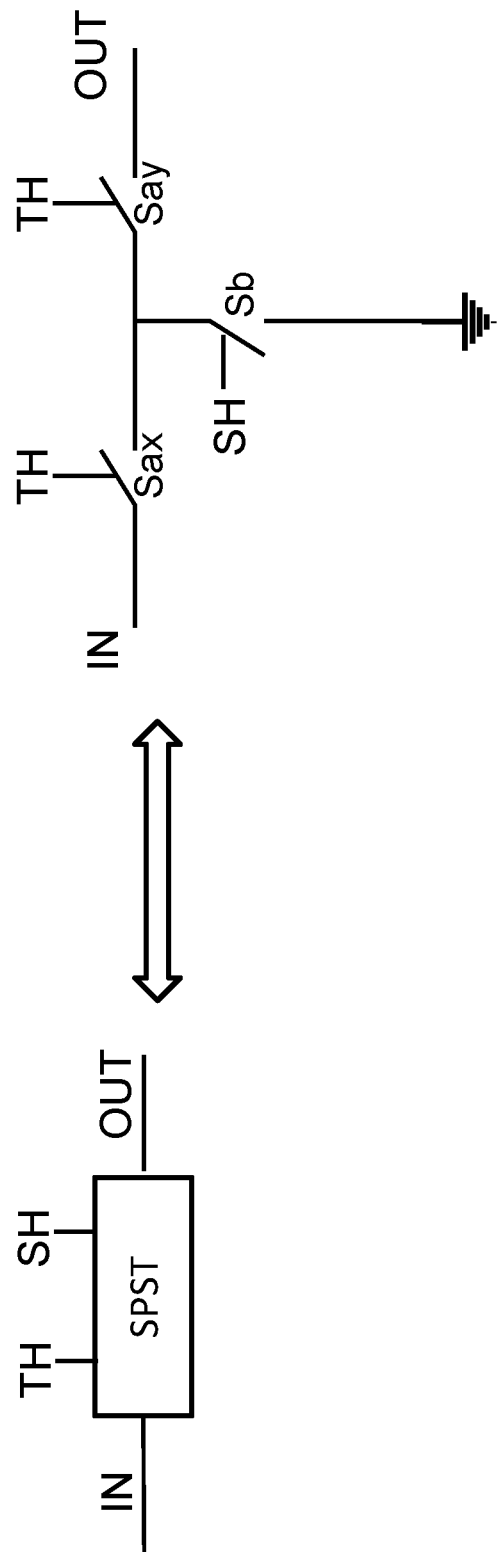
Figure 3:
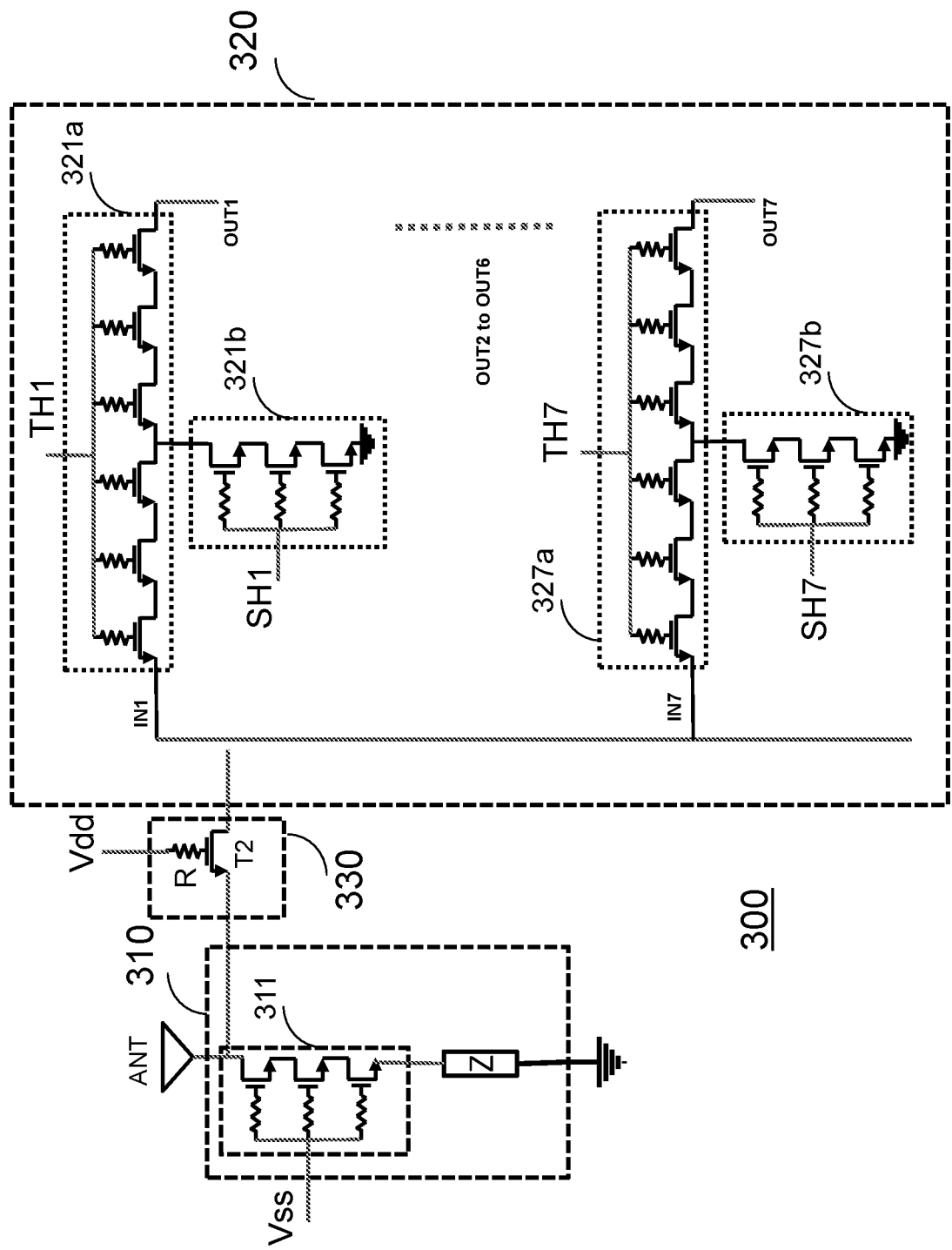
FIG. 3 shows an exemplary electronic circuit in accordance with another embodiment of the present disclosure.

FIG. 3 shows an electronic circuit (300) which is an exemplary implementation of the electronic circuit (200) of FIG. 2. Switch (330) comprises transistor (T2) and resistor (R) and represents an implementation of switch (S2) of FIG. 2. Similarly, switching circuit (320) represents an implementation of switching circuit (120) of FIG. 2. For example, a combination of the blocks (321a, 321b) is an implementation of SPST1 of FIG. 2. Continuing with the same example, block (321a) is essentially a switch stack of 6 serially connected transistors representing an implementation of the through switch (Sa) of FIG. 1B. Similarly, block (321b) comprises a switch stack implementing the shunt switch (Sb) of FIG. 1B. With further reference to FIG. 3, the termination circuit (310) is an exemplary implementation of the termination circuit (210) of FIG. 2, wherein block (311) comprising a switch stack of three serially connected transistors represents an implementation of switch (S1) of FIG. 2.

With further reference to FIG. 3, the functionality of the electronic circuit (300) and the interactions of various elements therein are similar to what was described with regards to electronic circuit (200) of FIG. 2. According to an embodiment of the present disclosure, all the transistors within the switching circuit (320) and the termination circuit (310) are native NMOS devices and transistor (T2) is a regular NMOS device. In the powered condition, Vdd and Vss are positive and negative voltages respectively. As a result, switch (330) is closed and switch (311) is open and the signal received by antenna (ANT) will be routed to one of the outputs (OUT1, . . . , OUT7) depending on the states of blocks (321a, 321b, . . . , 327a, 327b). On the other hand, in the unpowered condition, voltages (Vdd, Vss) are both at zero volts. As a result, switch (330) is open isolating switch circuit (320) from the termination circuit (310). Moreover, switch (311) is closed, terminating the antenna (ANT) by a desired impedance (Z). According to an embodiment of the present disclosure, impedance (Z) may be implemented and/or selected according to the requirements (e.g. 50 ohm, open, short, etc.)

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. An electronic circuit comprising:
a series arrangement of a first switch and a termination impedance;
a switching circuit including radio frequency (RF) switches;
a second switch coupling an antenna and the series arrangement of the first switch and the termination impedance to the switching circuit;
wherein:
a threshold voltage of the first switch is less than a threshold voltage of the second switch;
in a powered condition, the antenna is connected to the switching circuit and disconnected from the termination impedance, and
in an unpowered condition, the antenna is connected to the termination impedance and disconnected from the switching circuit.

2. The electronic circuit of claim 1, wherein:
in the powered condition, the first switch is in an OFF state and the second switch is in an ON state, and
in the unpowered condition, the first switch is in the ON state and the second switch is in the OFF state.

3. The electronic circuit of claim 2, wherein in the powered condition of the electronic circuit, the first switch receives a first supply voltage, and the second switch receives a second supply voltage different from the first supply voltage, and wherein in the unpowered condition of the electronic circuit, the first and the second switches receive zero bias voltages.

4. The electronic circuit of claim 3, wherein, in the powered condition of the electronic circuit, the first supply voltage is negative, and the second supply voltage is positive.

5. The electronic circuit of claim 4, wherein the first switch comprises a stack of two or more serially connected transistors.

6. The electronic circuit of claim 5, wherein the second switch comprises a stack of two more serially connected transistors.

7. The electronic circuit of claim 4, wherein the second circuit comprises a plurality of single-pole single-throw (SPST) switches.

8. The electronic circuit of claim 7, wherein each SPST switch of the plurality of SPST switches comprises a through switch and a shunt switch.

9. The electronic circuit of claim 8, wherein the though switch comprises a through switch stack comprising a plurality of native NMOS serially connected transistors.

10. The electronic circuit of claim 9, wherein the shunt switch comprises a shunt switch stack comprising a plurality of native NMOS serially connected transistors.

11. The electronic circuit of claim 8, wherein the through switch comprises a series connection of a first and a second through switch, both connected to a shunt switch.

12. The electronic circuit of claim 11, wherein each of the first and the second through switch and the shunt switch comprises a plurality of native NMOS serially connected transistors.

13. The electronic circuit of claim 1, wherein the first switch comprises one or more native NMOS transistors and the second switch comprises one or more regular NMOS transistors.

14. A method of terminating an antenna to a termination impedance, the method comprising:
providing a switching circuit including a plurality of switching transistors;
coupling the antenna to the termination impedance through a first switch, the first switch having a first threshold voltage;
coupling the antenna to the switching circuit through a second switch, the second switch having a second threshold voltage being greater than the first threshold voltage;
in a powered condition, turning the first switch to an OFF state, and the second switch to an ON state, and
in an unpowered condition, turning the first switch to an ON state, and the second switch to an OFF state.

15. The method of claim 14, further comprising:
in the powered condition, applying a first bias voltage to the first switch, and a second bias voltage to the second switch, the first bias voltage being less than the second bias voltage, and
in the unpowered condition, applying zeros bias voltages to the first and the second switch.

16. The method of claim 15, wherein the first switch comprises a native NMOS transistor and the second switch comprises a regular NMOS transistor.

* * * * *